United States Patent [19]

Kitayoshi

[11] Patent Number: 4,539,518
[45] Date of Patent: Sep. 3, 1985

[54] SIGNAL GENERATOR FOR DIGITAL SPECTRUM ANALYZER

[75] Inventor: Hitoshi Kitayoshi, Gyoda, Japan

[73] Assignee: Takeda Riken Co., Ltd., Tokyo, Japan

[21] Appl. No.: 533,780

[22] Filed: Sep. 19, 1983

[30] Foreign Application Priority Data

Sep. 24, 1982 [JP] Japan .................. 57-167370

[51] Int. Cl.³ .................................. G01R 23/16
[52] U.S. Cl. .................. 324/77 B; 364/576
[58] Field of Search ............ 364/553, 576, 484, 485, 364/310; 324/77 A, 77 B, 77 G, 77 H

[56] References Cited

U.S. PATENT DOCUMENTS

| 3,566,035 | 2/1971 | Noll | 324/77 G |
|---|---|---|---|
| 3,745,317 | 7/1973 | Berthier | 324/77 B |
| 3,803,391 | 8/1974 | Vernet | 324/77 B |
| 4,067,060 | 1/1978 | Poussart | 364/576 |
| 4,080,661 | 3/1978 | Niwa | 324/77 B |
| 4,093,988 | 6/1978 | Scott | 324/77 B |
| 4,243,935 | 1/1981 | McCool | 324/77 H |
| 4,296,374 | 10/1981 | Henry | 324/77 B |
| 4,301,404 | 11/1981 | Ley | 364/484 |
| 4,321,680 | 3/1982 | Bertrand | 364/576 |
| 4,408,284 | 10/1983 | Kijesky | 364/485 |

Primary Examiner—Michael J. Tokar
Attorney, Agent, or Firm—Staas & Halsey

[57] ABSTRACT

A signal generator generates a test signal for input to a device under test the output signal of which is subjected to fast Fourier transform analysis by a fast Fourier transformer. A waveform memory is read out in synchronism with data input to the fast Fourier transformer. The waveform memory has stored therein sample values of a composite waveform of a plurality of predetermined spectra. The output read out from the waveform memory is converted by a D/A converter into an analog signal for use as the test signal.

14 Claims, 4 Drawing Figures

SIGNAL GENERATOR FOR DIGITAL SPECTRUM ANALYZER

BACKGROUND OF THE INVENTION

The present invention relates to a signal generator which generates a test, signal for input to a device under test the output signal of which is analyzed by a fast Fourier transform analyzer, i.e. what is called a digital spectrum analyzer.

A fast Fourier transform analyzer (hereinafter referred to as the FFT analyzer) analyzes the response characteristic (the transfer function) of an electrical device, such as a transmission line, an amplifier, a filter or the like, when supplied with a test signal, or the response characteristic of a mechanical device, such as mechanical vibration or the like, when supplied with a mechanical test signal. In such an analysis, according to the prior art, a single spectrum, that is, a pure sine-wave signal is applied to the device under test and the frequency of the sine-wave signal is successively changed for the FFT analysis of the output signal from the device under test for each frequency. Accordingly, the conventional method, in which the test signal is produced for each frequency within a desired frequency range and the FFT analysis is conducted for each test signal, possesses the defect of extended measurement time.

On the other hand, it has been proposed to employ a noise generator as the signal generator as disclosed, for example, in U.S. Pat. No. 3,988,667 entitled "Noise Source for Transfer Function Testing", issued Oct. 26, 1976, or U.S. Pat. No. 4,023,098 entitled "Noise Burst Source for Transfer Function Testing", issued May 10, 1977. Since various spectra are provided from the noise generator simultaneously, the measurement time can be reduced. The FFT analyzer, however, is not able to analyze continuous frequency spectra and can analyze only discrete frequency spectra, so that unnecessary frequency components are applied to the FFT analyzer, causing a measurement error. This will hereinunder be described in brief.

In general, the FFT analyzer performs a discrete digital Fourier transformation of a signal by sampling it at $2^n$ finite discrete sample points with a sampling period $t_0$ in a finite time series, thereby analyzing $2^{n-1}$ spectra spaced $\frac{1}{2^n t_0}$ (Hz) from one another. That is, signals at $2^n$ discrete sample points in the time domain are mapped to a $2^n$-dimensional orthogonal Fourier space in the frequency domain. The Fourier space in which the signals are mapped is a complex plane representing $2^{n-1}$ spectra which are spaced $\frac{1}{2^n t_0}$ (Hz) apart. Expressed in the time domain, the spectra are each given by the following expression:

$$f_m(t) = a_m \cdot \sin\left(\frac{2\pi}{2^n t_0} mt + \theta_m\right) \quad (1)$$

When m is an integral value in the range from 0 to $2^{n-1}$ in the above expression (1), the signal can be correctly mapped to the Fourier transform mapping space by virtue of the orthogonality of the function. But when m is a non-integral value, for instance, 1.3, the spectrum component of the signal is not correctly mapped to the Fourier transform mapping space, but instead it is mapped to a plurality of complex spectral planes. This is commonly referred to as energy leakage in a finite time series. Accordingly, in the case of using a thermal noise generator or an M-series pseudo-random signal generator as the signal generator, the analysis result contains many frequency components resulting from the non-integral values of m in the above expression (1), and hence it has an error. To alleviate the energy leakage, it is customary in the prior art to multiply the time series data by a weighted function, for instance, $W(t) = 1 + \cos(2\pi/2^n t_0)t$, and to subject the time series data to discrete Fourier transformation. But since this weighted function also acts on the information of as many sample points as $2^n$, the amount of information of the sample points themselves is partly lost, that is, leakage is caused in the vicinity of the correct spectrum to lower the spectral resolution, resulting in decreased measurement accuracy and narrowed dynamic range.

To raise the measurement accuracy, it is general practice in the prior art to conduct the measurement a plurality of times and to average the measured results. This method is, however, defective in that the measurement time is extended by such repeated measurement; in particular, when the measurement frequency is low, the sampling period is increased, resulting in the overall measurement time becoming appreciably long.

Furthermore, when analyzing a transfer function of a nonlinear device, it is desired to apply thereto a random signal having a suitable amplitude probability density distribution such as a Gaussian distribution or Poisson's distribution, for example. In such a case it has been the practice to provide a plurality of dedicated random signal generators respectively having desired amplitude probability density distributions, thus requiring an increased size and cost, as a whole.

SUMMARY OF THE INVENTION

It is therefore an object of the present invention to provide a signal generator for a digital spectrum analyzer with which it is possible to obtain high measurement accuracy of an FFT analyzer and to reduce its measurement time.

Another object of the present invention is to provide an inexpensive signal generator of a simple structure capable of generating a random signal having a desired amplitude probability density distribution.

In accordance with the present invention, clock signals are generated which are synchronized with the input of sampled data to the FFT analyzer, and are counted by an address counter, and a waveform memory is read out with the count value of the address counter. The waveform memory has prestored therein, as a digital value at a sample point for each predetermined period, a waveform into which a plurality of predetermined spectra are combined, that is, a composite waveform of only spectra to be processed by the FFT analyzer or of such spectra that have been frequency-converted. Further, in order to permit the selection of a desired one of such composite waveforms, i.e. waveforms each of which has a different spectra, a plurality of waveforms are prestored in the waveform memory as required. The waveform memory is read out with the count value of the address counter as mentioned above, and the read output is converted into an analog signal, which is provided as a signal output (a test signal) from the signal generator. In this case, the frequency of the test signal is within a certain frequency range from zero. For generating a spectrum within a certain frequency range excluding zero frequency, as required, a sine-wave signal generator is provided (which can also be formed by a memory which is read out with a clock signal to generate a sine-wave signal). The sine-wave signal read out from the sine-wave generator and the output from the waveform memory are multiplied by a D/A multiplier, and the read Output of the waveform memory is frequency-converted and provided as an analog signal. In this case, the clock signal supplied to the address counter is frequency-divided by a variable frequency divider corresponding to a display magnification factor (a zooming factor) of the FFT analyzer. Moreover, in order to correct the frequency level of the sine-wave signal in the output signal, it is also possible to produce an analog correcting sine-wave signal of that frequency and to combine it with the frequency-converted analog signal for output for the frequency level correction.

For generation of a random signal having a desired amplitude probability distribution, samples of waveforms of functions respectively having desired amplitude probability density distributions are prestored in the waveform memory and the address counter is incremented by a random pulse signal to readout a desired one of the functions at random periods.

DESCRIPTION OF THE PREFERRED EMBODIMENTS

Figure 1:
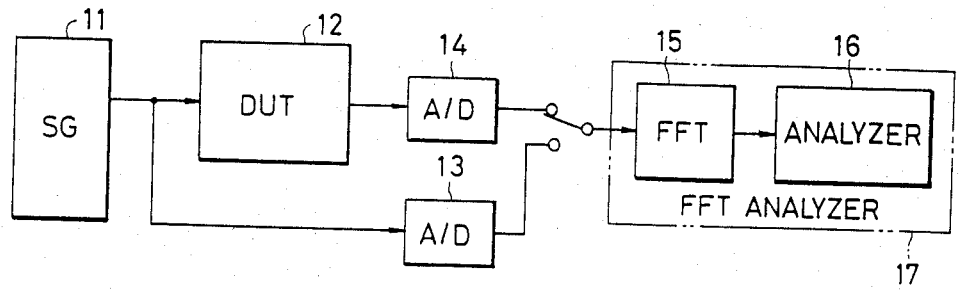
FIG. 1 is a block diagram illustrating the connections of a signal generator, a device under test and an FFT analyzer.

To facilitate a better understanding of the present invention, a description will be given of the relation between the signal generator and the FFT analyzer. As shown in FIG. 1, a signal generated by a signal generator 11 is applied to a device under test 12 and, at the same time, the input signal is converted by an A/D converter 13 into a digital signal, and the output signal from the device under test 12 is also converted by an A/D converter 14 into a digital signal. These digital signals are subjected to Fourier transformation by a fast Fourier transformer 15; namely, a signal of the time domain is converted into a signal of the frequency domain. The Fourier-transformed signal is analyzed by a digital analyzer 16. The fast Fourier transformer 15 and the digital analyzer 16 constitute an FFT analyzer 17.

In the prior art, the signal generator 11 for use with the FFT analyzer 17 is one that generates a sine-wave signal the frequency of which varies with time, or one that generates a noise signal. The use of such a sine-wave signal introduces the defect of extended measurement time. On the other hand, the noise signal contains a spectrum that cannot fully be analyzed by the FFT analyzer 17, so that the measurement accuracy is lowered. The measurement accuracy can be raised by conducting measurement a number of times and averaging the measured results, but this method of measurement is time-consuming.

Figure 2:
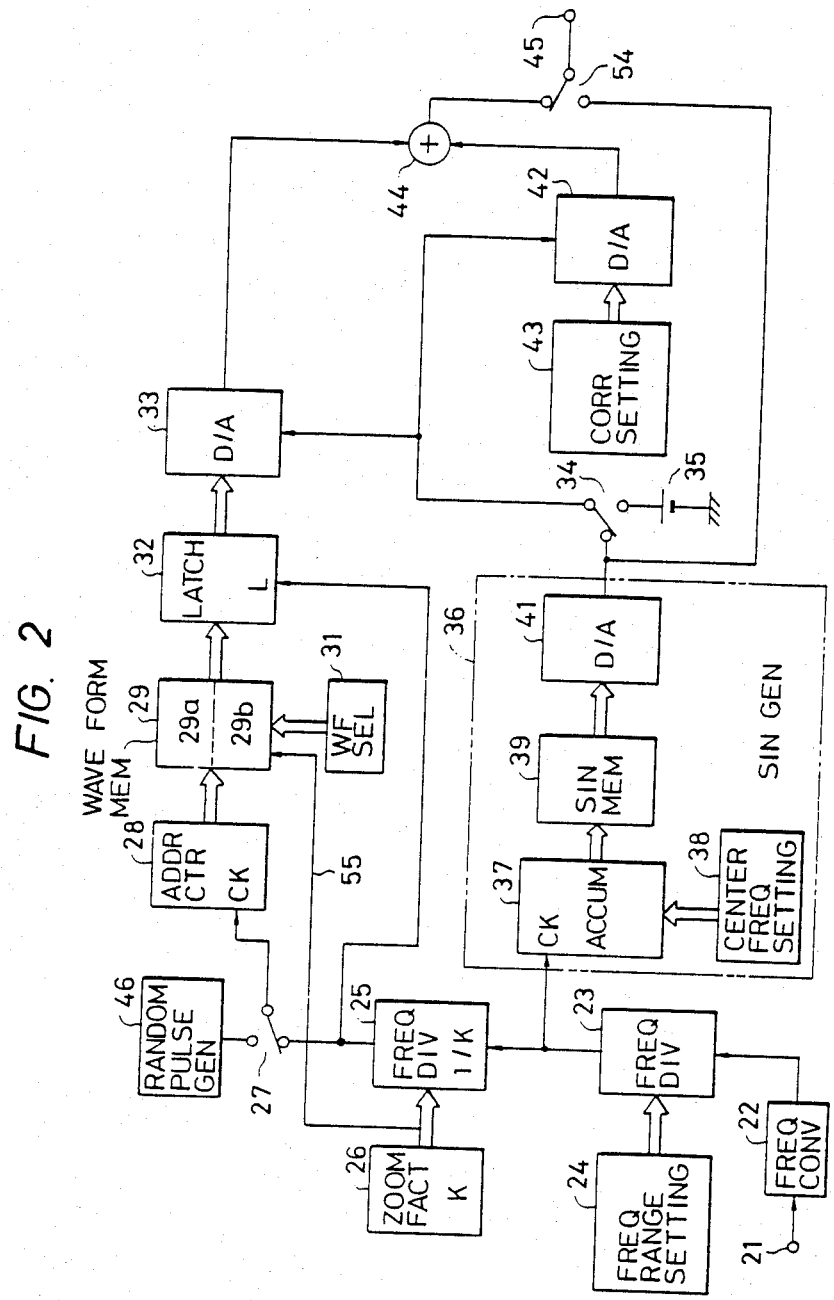
FIG. 2 is a block diagram illustrating an example of the signal generator of the present invention.

FIG. 2 illustrates an embodiment of the signal generator (identified by 11 in FIG. 1) of the present invention. A frequency converter 22 is provided via a terminal 21 with a clock signal in synchronism with the data input to the FFT analyzer 17 in FIG. 1, that is, a fundamental clock signal from which are made the sample clock signals in the A/D converters 13 and 14 and which is higher in frequency than these sample clock signals. The frequency converter 22 is formed by a phase lock loop or what is called PLL, and it converts the input clock signal into a clock signal which is synchronized therewith and has a frequency, for example, four times higher than the frequency of the input clock signal. At the same time, the frequency converter 22 removes from the input clock signal jitter which was applied thereto, for instance, on the transmission line before it is provided to the terminal 21. The thus frequency-converted clock signal is frequency-divided by a frequency divider 23 corresponding to a set value of a frequency range setter 24. The set value of the frequency range setter 24 is altered in accordance with a change in the sampling frequency of a sampling circuit for generating time series samples in the fast Fourier transformer 15 (in FIG. 1). The output frequency of the frequency divider 23 is a predetermined integral multiple, for example, four times, of the sampling frequency of the A/D converters 13 and 14.

The output of the frequency divider 23 is further frequency-divided by a frequency divider 25. The frequency dividing ratio of the frequency divider 25 is set to 1/k in accordance with a zooming factor k set by a zooming factor setter 26. A magnification coefficient for magnifying a certain frequency band for analysis by the FFT analyzer is the zooming factor k, which is an integer equal to or larger than 1 and, in the case of no magnification, the zooming factor k is 1.

The output of the frequency divider 25 is supplied via a changeover switch 27 to a clock terminal of an address counter 28. A waveform memory 29 is read out using the count value of the address counter 28. The waveform memory 29 has prestored therein sample values at equally spaced sample points of a composite waveform having a plurality of spectra. Accordingly, by successively reading out the sample values, the composite waveform is obtained in digital form. The waveform memory 29 has prestored therein a plurality of waveforms as required, and the waveforms are selectively read out in accordance with the setting of a selector 31; namely, the area of the memory 29 to be read out is selected by the setting of the selector 31.

Data of a weighted multiple sine wave to be stored in the waveform memory 29 is such as follows:

$$f(t) = \sum_{i=1}^{134} \sin\{[3i - 1) \cdot 2\pi + \theta_i] \cdot t/N\} \times \left\{ \tfrac{1}{2} + \cos\left(2\pi \cdot \frac{t}{N} + \phi_i\right)\right\} \tag{2}$$

In the above expression (2), the value of f(t), which is obtained by substituting each integer from 0 to N for t, is the sample value at each of N sample points of the multiple sine wave. In the above expression (2), $\theta_i$ is $-\pi \leq \theta_i < \pi$ and is the minimum one of the values which give maximum instantaneous values of the ith term of f(t); $\phi_i = 2\pi/N \times (3^i - 1)$; and $[\tfrac{1}{2} + \cos(2\pi \cdot t/N + \phi_i)]$ is the weight function. By adding three sine-wave spectra obtained by multiplying the sine term by $\tfrac{1}{2}$ and multiplying the sine and cosine terms of f(t) for all values of i from 0 to N, the waveform of the multiple sine composite wave is obtained which includes a total of $134 \times 3 = 402$ spectra. In this case, for instance, N is 4096.

Further, there are stored in the waveform memory 29 N sample values of a signal into which sine waves each having a different frequency equal to an integral multiple of the frequency resolution, $\frac{1}{2^n t_0}$, of the FFT analyzer are combined by the number of lines $2^{n-1}$ to be analyzed. That is, N sample values of a signal which can be expressed by $$f(t) = \sum_{m=1}^{2^{n-1}} a_m \cdot \sin\left(\frac{2\pi}{2^n t_0} mt + \theta_m\right) \quad (3)$$

are stored in the waveform memory 29.

A frequency sweep signal waveform may also be stored in the waveform memory 29 as follows. Letting a sweep start angular frequency and a sweep end angular frequency be represented by $\omega_i$ and $\omega_s$, the following relations is obtained $$f(t) = \sin\{(\omega_i + \omega_n) \cdot t/N\} \quad (4)$$

where $$\omega_n = t/N \cdot (\omega_s - \omega_i).$$

Each value of f(t), which is obtained by substituting each integer from 0 to N for t in the above expression (4), is the sample value at each of N sample points representing the sweep signal waveform. The above said "N" is selected, for example, to be an integral multiple, larger than 1 of 1024, for instance, four times, i.e. 4096. In the case of a frequency sweep from 1 to 100 Hz, the abovesaid angular frequencies are selected as follows:

$$\omega_i = 2\pi \times 1$$

$$\omega_s = 2\pi \times 100$$

When having read out from the waveform memory 29 all sample values of one waveform, that is, when having counted N, the address counter 28 reaches its full count and then counts again from zero.

The output read out from the waveform memory 29 is latched by a latch circuit 32 in synchronism with the output clock signal of the frequency divider 25, and the output of the latch circuit 32 is converted by a D/A converter 33 into an analog signal. The D/A converter 33 is a digital-analog multiplier which produces an analog signal obtained by multiplying respective digital and analog values, namely which is supplied at its digital input terminal with the output digital value of the latch circuit 32 and at its reference power source terminal with an analog signal. To the reference power source terminal are selectively applied by a switch 34 a fixed DC analog value from a power source 35 and the output sine-wave signal from a sine-wave signal generator 36.

When providing the sine-wave signal from the sine-wave signal generator 36 to the D/A converter 33, the digital waveform signal from the latch circuit 32 is frequency-converted by the sine-wave signal.

The sine-wave signal generator 36 is supplied at a clock terminal of an accumulator 37, for example, with the output of the frequency divider 23. Upon each application of the clock to the accumulator 37, the set value of a center frequency setter 38 is accumulated. A sine-wave memory 39 is read out using the accumulated value as an address therefor. The sine-wave memory 39 has stored therein a sinusoidal waveform in a digital form, and the signal read out therefrom is converted by a D/A converter 41 to an analog signal for output as the output signal of the sine-wave signal generator 36. The larger the set value of the center frequency setter 38 is selected, the shorter becomes the period with which the complete sinusoidal waveform from the sine-wave memory 39 is read out. Accordingly, a higher frequency sine-wave signal is obtained. Conversely, a decrease in the set value of the center frequency setter 38 causes an increase in the time for reading out the complete waveform from the sine-wave memory 39, resulting in lowering the frequency of the sine-wave signal read out.

A D/A converter 42 is provided for multiplying the respective analog and digital signals to generate a correction signal. By the D/A converter 42 a digital value set in a correction setter 43 is multiplied by an analog value from the switch 34 for output in analog form. The multiplied outputs from the D/A converters 33 and 42 are added by an adder 44 and the added output is provided to an output terminal 45 of the signal generator 11.

Figure 3:
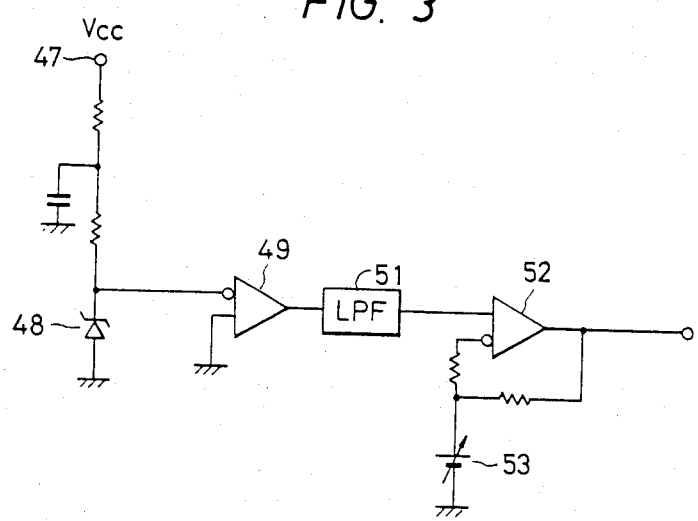
FIG. 3 is a connection diagram showing an example of a noise signal generator.

A random pulse generator 46 is provided for generating a random pulse signal as required and its output is selectively supplied via the switch 27 to the address counter 28. In the random pulse generator 46, for example, as shown in FIG. 3, current is applied from a power source terminal 47 to such a noise source as a Zener diode 48 and the resulting thermal noise therein is amplified by an amplifier 49, the amplified output of which is filtered by a lowpass filter 51 to eliminate frequency components higher than a predetermined cutoff frequency, thereafter being provided to a non-inverting input terminal of a comparator 52. The level of the thermal noise is compared with a threshold level given by a DC voltage from a variable voltage source 53 to obtain random pulses from the comparator 52. The threshold voltage of the comparator 52 is adjustable by changing the output voltage of the variable voltage source 53.

In FIG. 2 the added output of the adder 44 and the output sine-wave signal of the sine-wave generator 36 are selectively supplied via a switch 54 to the output terminal 45 as required.

With the signal generator of such an arrangement as described above, when a spectrum waveform within a certain frequency range from zero is to be generated, a composite waveform of the desired spectra is selected by the waveform selector 31 and the analyzing frequency range of the FFT analyzer employed in combination with this signal generator is set in the range setter 24 and, further, the zooming factor setter 26 is set to $k = 1$. The switch 27 is set to the side of the frequency divider 25 and the switch 34 is set to the side of the power source 35.

By such initialization the address counter 28 is stepped by the output of the frequency divider 25 and, in consequence, each digital value of the selected waveform is read out from the waveform memory 29 and the converted output of the D/A converter 33 becomes an analog signal of the selected waveform. That is, there is derived at the output terminal 45 an analog signal of the composite waveform of only the spectra desired to analyze. In the case of providing such a composite signal to a device under test for analysis, it contains only those frequency components which are known and expected to be obtained in the fast Fourier transformation, so that no errors are caused by other unnecessary frequency components; therefore, high precision analysis can be achieved.

In order to produce a signal for a magnified analysis within a certain frequency range exclusive of zero, the value k of the zooming factor setter 26 is set to a value corresponding to the magnification coefficient at the FFT analyzer and, at the same time, the center frequency of the frequency range is set in the center frequency setter 38 and the sine-wave output is obtained from the sine-wave signal generator 36 and provided via the switch 34 to the D/A converters 33 and 42. Accordingly, the waveform signal read out from the waveform memory 29 in the same manner as described previously comprises spectra of compressed frequency intervals (i.e. 1/k of the original frequency intervals), which is then frequency-converted by the sine-wave signal of the sine-wave signal generator 36 to have the set center frequency while keeping the compressed frequency intervals, providing at the output terminal 45 an analog signal of the composite waveform of only the desired spectra within the desired frequency band. When the sine-wave signal and the output of the waveform memory 29 are multiplied, the spectral distribution of the output of the sine-wave memory 29 is positioned on either side of the sine-wave signal frequency and, on the display surface of the FFT analyzer, a display is provided with a spectral density that is two times higher than that in the case of k=1. Accordingly, in the case of k>1, alternate ones of data of the waveform memory 29 for the same waveform as in the case of k=1 are stored in the waveform memory 29 and a signal indicating whether the zooming factor k set in the zooming factor setter 26 is 1 is applied via signal line 55 to the waveform memory 29 to select one of a non-zoom data area 29a and a zoom data area 29b. The D/A converter 42 sets the DC level in the case of producing a signal within a certain frequency range from zero, and outputs a corrective value of the level of the center frequency in the case of producing a signal within a frequency range exclusive of zero. That is, in the output obtained by multiplying the output of the waveform memory 29 and the sine-wave signal, the frequency component of the sine-wave signal is higher in level than the other frequency components, and hence this level difference is corrected.

In the case of analyzing a transfer function of a nonlinear device, the switch 27 is connected to the side of the random pulse generator 46. As a result, the address counter 28 is incremented at random intervals, by which a random waveform signal can be generated from the waveform memory 29. In this case the amplitude probability density distribution of the generated random waveform signal is substantially the same as that of the waveform in the memory which has been accessed. In the waveform memory 29 are prestored waveforms of various functions having desired amplitude probability density distributions, such as Gaussian distribution, Poisson's distribution and the like, which are selectively designated by the waveform selector 31 to be accessed. For example, when a multiple sine-wave defined by the expression (3) is accessed, the output of the waveform memory 29 becomes a random waveform signal having an amplitude probability density of a Gaussian distribution. Thus, it is possible to generate a random waveform signal having a desired amplitude probability density distribution.

A single sine-wave signal can be yielded by connecting the switch 54 to the output side of the sine-wave generator 36.

Figure 4:
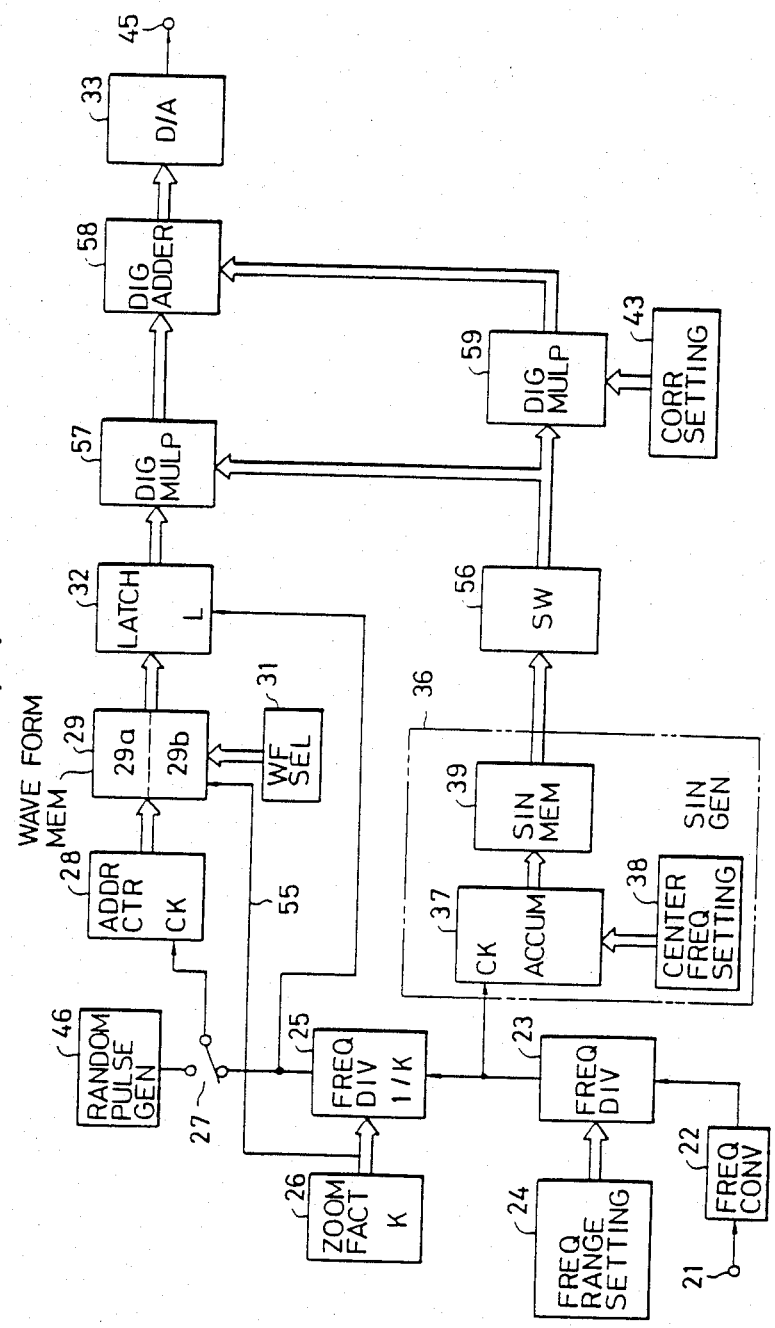
FIG. 4 is a block diagram illustrating another example of the signal generator of the present invention.

While the embodiment of FIG. 2 is adapted so that the sine-wave signal is applied to the D/A converter 33 for multiplication, it is also possible to adopt such an arrangement, for instance, as shown in FIG. 4. In FIG. 4, the digital sine-wave signal is delivered from the sine-wave memory 39 in the sine-wave generator 36 and provided via a switch 56 to a digital multiplier 57, wherein it is multiplied by the digital waveform output from the latch circuit 32, and the multiplied output is applied to a digital adder 58. On the other hand, the digital sine-wave signal from the sine-wave memory 39 is supplied via the switch 56 to a correction signal generating digital multiplier 59, wherein it is multiplied by the set value of the correction setter 43. The multiplied output is provided to the adder 58, wherein it is added to the output of the multiplier 57 to correct the sine-wave signal component, and the added output is applied to the D/A converter 33.

As has been described in the foregoing, according to the present invention, the signal generator operates in synchronism with the fundamental clock (the data input) of the FFT analyzer and provides an analog signal which has only a plurality of spectra to be analyzed, and hence it permits the reduction of an analysis error. In the prior art, in the case of employing random noise as a signal to be applied to a device under test, measurement is repeated hundreds to thousands of times and the measured results are averaged for raising the accuracy of analysis. In contrast thereto, according to the present invention, in the case of using, for example, the aforesaid weighted multiple sine wave, substantially the same measurement accuracy can be obtained with one measurement; namely, high precision measurement can be achieved in a short time. With the present invention, it is possible to obtain a plurality of spectra within a certain frequency range as required. In addition, also in this case, the spectrum of the output analog signal can be brought into agreement with the spectrum to be analyzed. In the case of measurement of a device having a nonlinear characteristic, the use of a periodic signal may sometimes cause a measurement error, but this can be avoided through the use of the thermal noise generator 46. By preparing a combination of preferred waveforms in accordance with various devices to be tested, that is, a plurality of preferred spectra, for example, by prestoring sweep signal waveforms, multiple sine waves, weighted multiple sine waves or the like in the waveform memory 29, these waveforms can selectively be output in accordance with a particular device to be tested. Also in the case of employing an aperiodic signal, it is possible to prestore desired amplitude probability density functions in the memory 29 and to selectively provide them.

Moreover, a signal of double spectral density can easily be obtained by multiplying the output of the waveform memory 29 by a sine-wave signal. In this case, by selecting the frequency of the sine-wave signal and the set value k of the zooming factor setter 26, spectra within a desired frequency range centering about an arbitrary frequency can be obtained. Further, since any waveform is read out from the waveform memory having prestored it, a signal of excellent spectral flatness can be obtained by preselecting the waveform. In the case of generating random pulses by using thermal noise for reading out the waveform memory instead of directly applying the output signal of the random pulse generator 46 to the device under test, the readout period (the spectral density) by the random pulses can be optimized for the FFT analyzer and the output signal is not directly affected by the temperature of the thermal noise. Besides, by excluding the DC component from the waveform which is stored in the waveform memory 29 and by adding the output of the D/A converter 33 in an analog manner with the DC component derived from the D/A converter 42, the precision of the level of the DC component can be raised. In a similar manner, the level of the center frequency of the output signal can be corrected in the case of multiplying the output of the waveform memory 29 by the sine-wave signal.

It will be apparent that many modifications and variations may be effected without departing from the scope of the novel concepts of the present invention.

What is claimed is:

1. A signal generator for a digital spectrum analyzer in which a test signal from the signal generator is supplied to a device under test and a signal therefrom is sampled and input into a fast Fourier transform analyzer for analysis, comprising:
   clock generating means for generating a clock signal synchronized with the input of the sampled signal into the fast Fourier transform analyzer;
   an address counter for counting the clock signal generated by the clock generating means and providing a corresponding count value;
   a waveform memory connected to the address counter and read out with said count value used as an address, the waveform memory having stored therein, as a digital value, the amplitude value at each of equally spaced points of a composite waveform of a plurality of predetermined spectra divided in the time-axis direction by an integral multiple of the number of sample points necessary for one analysis by the fast Fourier transform analyzer; and
   a D/A converter connected to the output side of the waveform memory, for converting the output read out therefrom into an analog signal for output as the test signal.

2. A signal generator according to claim 1, including: a variable frequency divider connected to the input side of the address counter, for frequency-dividing the clock signal input thereto; a frequency dividing ratio setter for setting the frequency dividing ratio of the variable frequency divider; a sine-wave generator supplied with the input clock signal of the variable frequency divider, for generating a sine-wave signal synchronized with the clock signal and having a period which is an integral multiple of the period of the clock signal; a frequency setter for setting the frequency of the sine-wave signal generated by the sine-wave generator; and means for multiplying the sine-wave signal from the sine-wave generator and the read output from the waveform memory.

3. A signal generator according to claim 2, wherein said multiplying means is said D/A converter and the sine-wave signal generated by said sine-wave generator is an analog sine-wave signal.

4. A signal generator according to claim 3, further including: a correction signal generator supplied with the analog sine-wave signal from the sine-wave generator, for adjusting the amplitude of the sine-wave signal to output a correction signal; and an analog adder for adding the correction signal from the correction signal generator and the output of the D/A converter to output the test signal.

5. A signal generator according to claim 3, wherein the frequency setter sets a numerical value corresponding to the frequency of the sine-wave signal to be generated, and wherein the sine-wave generator comprises an accumulator for accumulating, upon each occurrence of the input clock signal, the numerical value set in the frequency setter, a sine-wave memory having stored therein sample values of the analog sine-wave signal at regular intervals and being read out by the added value of the accumulator, and a second D/A converter for converting the sample value read out from the sine-wave memory into an analog signal for use as the analog sine-wave signal.

6. A signal generator according to claim 2, wherein the sine-wave signal generated by the sine-wave generator is a digital sine-wave signal and said multiplying means is a digital multiplier inserted between the output side of said waveform memory and the input side of said D/A converter.

7. A signal generator according to claim 6, further including a correction signal generator supplied with the digital sine-wave signal from the sine-wave generator, for adjusting the level of the sine-wave signal to output a correction signal; and a digital adder inserted between the output side of said digital multiplier and the input side of said D/A converter for adding the correction signal from the correction signal generator and the multiplication result by the digital multiplier for input to the D/A converter.

8. A signal generator according to claim 6, wherein the frequency setter sets a numerical value corresponding to the frequency of the sine-wave signal to be generated, and wherein the sine-wave generator comprises an accumulator for accumulating, upon each occurrence of the input clock signal, the numerical value set in the frequency setter, and a sine-wave memory having stored therein sample values of the analog sine-wave signal at regular intervals and being read out by the added value of the accumulator to output the digital sine-wave signal.

9. A signal generator according to claim 1, which further includes a random pulse generator for generating a random pulse signal and a switch for selectively supplying the random pulse signal from the random pulse generator and the synchronized clock signal to the address counter, and wherein the waveform memory has stored therein a waveform having a desired amplitude probability density distribution so that it is read out when the random pulse signal is being supplied to the address counter.

10. A signal generator according to claim 1, further including a variable frequency divider supplied with said clock signal on which is based a sample clock for input to the fast Fourier transform analyzer, for frequency dividing the clock signal to output the synchronized clock signal; and a frequency dividing ratio setter for setting the frequency dividing ratio of the variable frequency divider in accordance with an input sample frequency of the fast Fourier transform analyzer, so as to output from the variable frequency divider a clock signal of a frequency which is an integral multiple of the sample frequency.

11. A signal generator according to claim 2, wherein areas of the waveform memory to be read out are changed over depending on whether the clock signal is frequency-divided by the variable frequency divider, and wherein the waveform memory has stored, in the area to be read out in the case of frequency dividing the clock signal, the amplitude values at a density twice higher than the density of the amplitude values of the same waveform in the area to be read out in the case of the clock signal being not frequency-divided.

12. A signal generator according to claim 1, wherein the waveform memory has stored therein a plurality of waveforms, and which further includes a waveform selecting address generator.

13. A signal generator according to claim 9, wherein said random pulse generator comprises a thermal noise generating means for generating a thermal noise signal, a lowpass filter for eliminating frequency components of the thermal noise signal higher than a predetermined cutoff frequency, and a comparator connected to the output of said lowpass filter for producing a pulse when the level of the thermal noise signal exceeds a predetermined threshold level, whereby said random pulse signal is generated.

14. A signal generator according to claim 1 or 9, comprising a latch means connected to the output of said waveform memory for latching the readout value from said waveform memory in synchronism with said clock signal.

* * * * *

UNITED STATES PATENT AND TRADEMARK OFFICE
CERTIFICATE OF CORRECTION

PATENT NO. : 4,539,518
DATED : Sep. 3, 1985
INVENTOR(S) : HITOSHI KITAYOSHI

It is certified that error appears in the above-identified patent and that said Letters Patent is hereby corrected as shown below:

Column 1, line 8, "test" should be --test,--;
line 57, equation (1), "fm" should be --$f_m$--.

Column 3, line 6 "Output" should be --output--.

Column 5, line 20, after "$w_s$," insert --respectively--;
line 33, "1" should be --1,--.

Column 8, line 55 "aperiodic" should be --a periodic--.

Signed and Sealed this

Thirty-first Day of December 1985

[SEAL]

Attest:

DONALD J. QUIGG

Attesting Officer

Commissioner of Patents and Trademarks